(12) United States Patent
Kim et al.

(10) Patent No.: US 11,322,563 B2
(45) Date of Patent: May 3, 2022

(54) ELECTROLUMINESCENT DEVICE WITH IMPROVED LUMINOUS EFFICIENCY AND VIEWING ANGLE AND METHOD OF MANUFACTURING THE SAME

(71) Applicant: Dongwoo Fine-Chem Co., Ltd., Iksan-si (KR)

(72) Inventors: Hun-Sik Kim, Incheon (KR); Jong-Soo Lee, Pyeongtaek-si (KR)

(73) Assignee: Dongwoo Fine-Chem Co., Ltd., Iksan-si (KR)

( * ) Notice: Subject to any disclaimer, the term of this patent is extended or adjusted under 35 U.S.C. 154(b) by 0 days.

(21) Appl. No.: 16/267,680

(22) Filed: Feb. 5, 2019

(65) Prior Publication Data

US 2019/0245021 A1 Aug. 8, 2019

(51) Int. Cl.
*H01L 27/32* (2006.01)
*H01L 51/52* (2006.01)
(Continued)

(52) U.S. Cl.
CPC ........ *H01L 27/3258* (2013.01); *H01L 27/156* (2013.01); *H01L 27/3246* (2013.01);
(Continued)

(58) Field of Classification Search
CPC ............. H01L 27/3258; H01L 27/3246; H01L 27/156; H01L 51/5209; H01L 51/56; H01L 2227/323
(Continued)

(56) References Cited

U.S. PATENT DOCUMENTS

2009/0115705 A1* 5/2009 Miller .................. G09G 3/3208
345/76
2014/0062292 A1* 3/2014 Seong ................. H01L 51/5253
313/504
(Continued)

FOREIGN PATENT DOCUMENTS

KR 10-2007-0037093 A 4/2007
KR 10-0815145 B 3/2008
(Continued)

OTHER PUBLICATIONS

Korean Notice of Reasons for Rejection for Korean Application No. 10-2018-0015608, dated Dec. 30, 2020, 7 pages with English translation.

(Continued)

*Primary Examiner* — Quoc D Hoang
(74) *Attorney, Agent, or Firm* — TraskBritt (57) ABSTRACT

Described is an electroluminescent device including an array substrate having a thin-film transistor formed thereon, an organic insulating layer formed on the array substrate having the thin-film transistor formed thereon, barriers disposed on the organic insulating layer, an anode formed on the organic insulating layer between the barriers to thus be electrically connected to the thin-film transistor and configured to cover at least a portion of the barriers, a light-emitting layer formed on the anode, and a cathode formed on the light-emitting layer, thus exhibiting superior emission efficiency and a wide viewing angle. A method of making or manufacturing the electroluminescent device is also described.

5 Claims, 6 Drawing Sheets

(51) Int. Cl.
*H01L 51/56* (2006.01)
*H01L 27/15* (2006.01)

(52) U.S. Cl.
CPC ...... *H01L 27/3248* (2013.01); *H01L 51/5209* (2013.01); *H01L 51/5218* (2013.01); *H01L 51/56* (2013.01); *H01L 2227/323* (2013.01); *H01L 2251/5315* (2013.01)

(58) Field of Classification Search
USPC .......................................................... 257/72
See application file for complete search history.

(56) References Cited

U.S. PATENT DOCUMENTS

| | | | |
|---|---|---|---|
| 2014/0225089 A1* | 8/2014 | Kato | H01L 27/3246 257/40 |
| 2018/0190739 A1* | 7/2018 | Paek | H01L 27/3246 |
| 2019/0115561 A1* | 4/2019 | Tang | H01L 27/3258 |

FOREIGN PATENT DOCUMENTS

| | | |
|---|---|---|
| KR | 10-2010-0032187 A | 3/2010 |
| KR | 10-2013-0126478 A | 11/2013 |
| KR | 10-2014-0067265 A | 6/2014 |
| KR | 10-2017-0063288 A | 6/2017 |

OTHER PUBLICATIONS

Korean Decision of Grant for Korean Application No. 10-2018-0015608, dated Sep. 29, 2021, 7 pages with English Translation.

\* cited by examiner

ELECTROLUMINESCENT DEVICE WITH IMPROVED LUMINOUS EFFICIENCY AND VIEWING ANGLE AND METHOD OF MANUFACTURING THE SAME

CROSS REFERENCE TO RELATED APPLICATION

This application claims the benefit of Korean Patent Application No. KR 2018-0015608, filed Feb. 8, 2018, the disclosure of which is hereby incorporated herein in its entirety by this reference.

TECHNICAL FIELD

This disclosure relates to an electroluminescent device and a method of manufacturing the same.

BACKGROUND

With the recent advancement of information society, the requirement for a greater variety of forms in the display field is increasing. Accordingly, a variety of flat panel display devices having characteristics such as slimness, light weight, and low power consumption, for example, a liquid crystal display device, a plasma display panel device, and an electroluminescent display device, are under study.

For example, an electroluminescent display device includes a display panel formed using an electroluminescent device. Electroluminescent devices are largely classified into inorganic electroluminescent devices and organic electroluminescent devices depending on the material of a light-emitting layer. The electroluminescent device is a self-luminous device that emits light by itself and has a high response speed, high emission efficiency, high luminance, and a wide viewing angle. Among these electroluminescent devices, the organic electroluminescent device, which is an electroluminescent device using an organic material, has advantages such as low direct-current driving voltage, ease of formation of a thin film, uniformity of emitted light, ease of pattern formation, high emission efficiency comparable to other electroluminescent devices, and color luminescence throughout the entire visible range, and thus thorough research thereto for application to display devices is ongoing.

Korean Patent No. 10-0815145 discloses an organic electroluminescent device and a method of manufacturing the same, but there is still a need for a display device that exhibits further improved emission efficiency and viewing angle.

BRIEF SUMMARY

Accordingly, this disclosure provides an electroluminescent device having superior emission efficiency and a wide viewing angle.

In addition, this disclosure provides a method of manufacturing an electroluminescent device having superior emission efficiency and a wide viewing angle.

The disclosure provides an electroluminescent device comprising an array substrate having a thin-film transistor formed thereon, an organic insulating layer formed on the array substrate having the thin-film transistor formed thereon, barriers disposed on the organic insulating layer, an anode formed on the organic insulating layer between the barriers and on the side slopes of the barriers and electrically connected to the thin-film transistor, a light-emitting layer formed on the anode, and a cathode formed on the light-emitting layer.

In addition, this disclosure provides a method of manufacturing an electroluminescent device comprising forming a thin-film transistor on an array substrate, forming an organic insulating layer on the array substrate having the thin-film transistor formed thereon, disposing barriers on the array substrate having the organic insulating layer formed thereon, forming an anode on the organic insulating layer between the barriers and on the side slopes of the barriers so as to be electrically connected to the thin-film transistor, forming a light-emitting layer on the anode, and forming a cathode on the light-emitting layer.

According to embodiments of this disclosure, an electroluminescent device is configured such that an anode is formed on the organic insulating layer between barriers and on the side slopes of the barriers, thus enlarging the emission area to thereby significantly improve emission efficiency and exhibit a superior viewing angle.

DETAILED DESCRIPTION

This disclosure pertains to an electroluminescent device comprising an array substrate having a thin-film transistor formed thereon, an organic insulating layer formed on the array substrate having the thin-film transistor formed thereon, barriers disposed on the organic insulating layer, an anode formed on the organic insulating layer between the barriers and on the side slopes of the barriers and electrically connected to the thin-film transistor, a light-emitting layer formed on the anode, and a cathode formed on the light-emitting layer, thereby exhibiting superior emission efficiency and a wide viewing angle, and to a method of manufacturing the same.

Hereinafter, a detailed description will be given of embodiments of this disclosure with reference to the accompanying drawings, which are set forth to illustrate preferred embodiments of this disclosure and serve to promote further understanding of the technical idea of this disclosure, as well as the contents of the above-mentioned disclosure, and, thus, the disclosure should not be construed as being limited to the matters described in the drawings.

Figure 1:
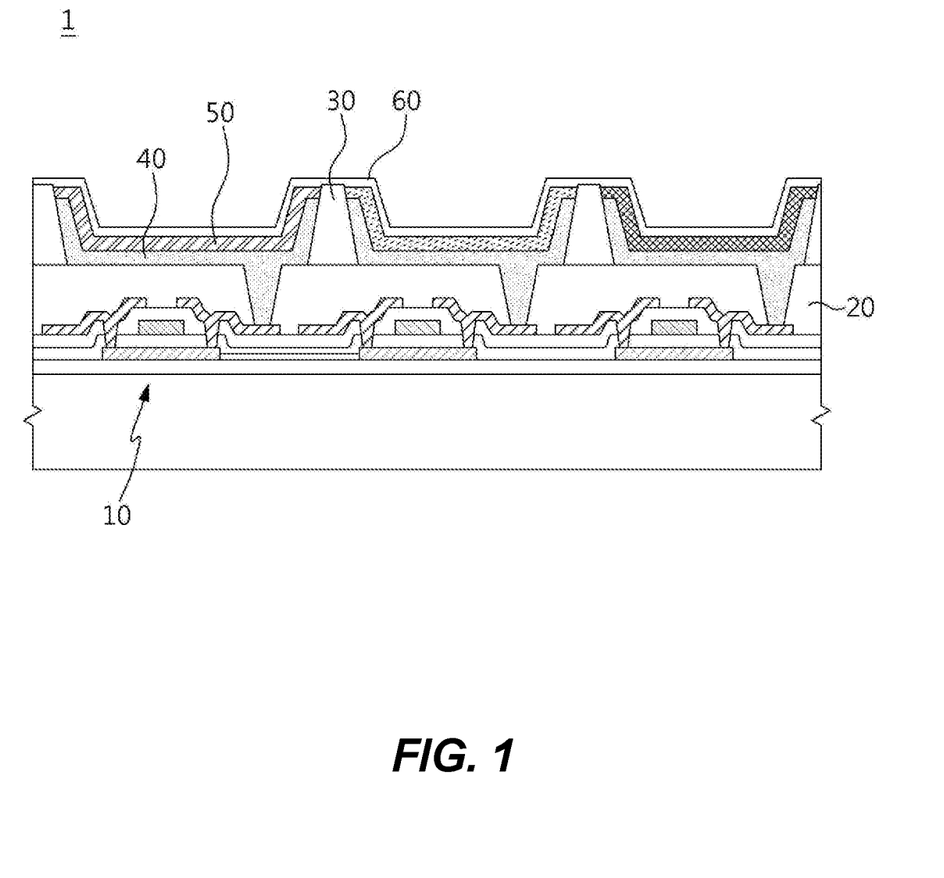
FIG. 1 is a schematic cross-sectional view showing an electroluminescent device according to an embodiment of this disclosure.

FIG. 1 is a schematic cross-sectional view showing an electroluminescent device according to an embodiment of this disclosure.

With reference to FIG. 1, the electroluminescent device 1 according to the disclosure includes an array substrate 10, an organic insulating layer 20, barriers 30, an anode 40, a light-emitting layer 50, and a cathode 60.

The array substrate 10 according to the disclosure includes a thin-film transistor 15 formed thereon.

Figure 2A:
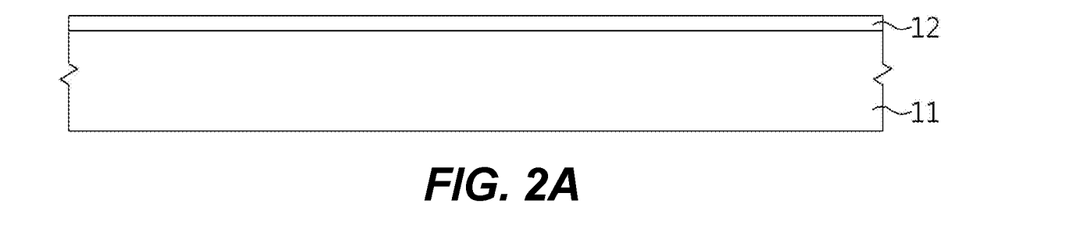
FIGS. 2A through 2H are cross-sectional views showing a process of manufacturing an electroluminescent device according to an embodiment of the disclosure.
Figure 2B:
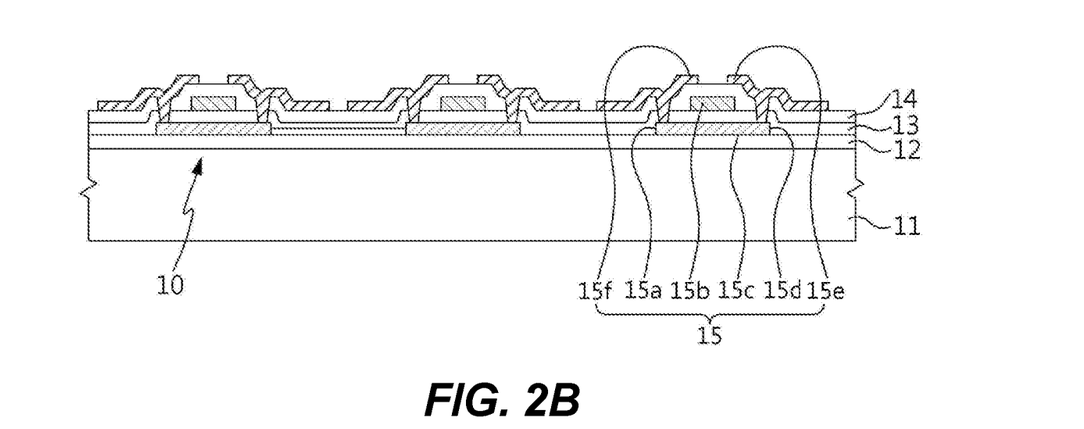

For example, referring to FIGS. 2A and 2B, the array substrate 10 includes a substrate 11 and a blocking layer 12 formed on the entire upper surface of the substrate 11 so as to prevent damage to a semiconductor device due to impurities, and the thin-film transistor 15 is formed on the array substrate 10.

The substrate 11 may be made of a material having transparency equal to or higher than a reference value, including a transparent insulating material, such as glass, quartz, sapphire and ceramic, or a transparent flexible material such as plastic.

The thin-film transistor 15 is not particularly limited, so long as it is typically useful in the art, and may be configured to include, for example, an active layer comprising a source electrode region 15a, a channel pattern 15c and a drain electrode region 15d formed on the array substrate 10, a gate insulating film 13 formed on the entire surface of the array substrate including the active layer, a gate electrode 15b formed on the gate insulating film 13 on the channel pattern 15c, a source/drain insulating film 14 formed on the entire surface of the array substrate including the gate electrode 15b, and a source electrode 15f and a drain electrode 15e formed on the source/drain insulating film 14 so as to be electrically connected to the source electrode region 15a and the drain electrode region 15d via contact holes formed on the source electrode region 15a and the drain electrode region 15d.

The organic insulating layer 20 (see FIG. 2C) is formed on the array substrate 10 having the thin-film transistor 15 formed thereon.

Figure 2C:
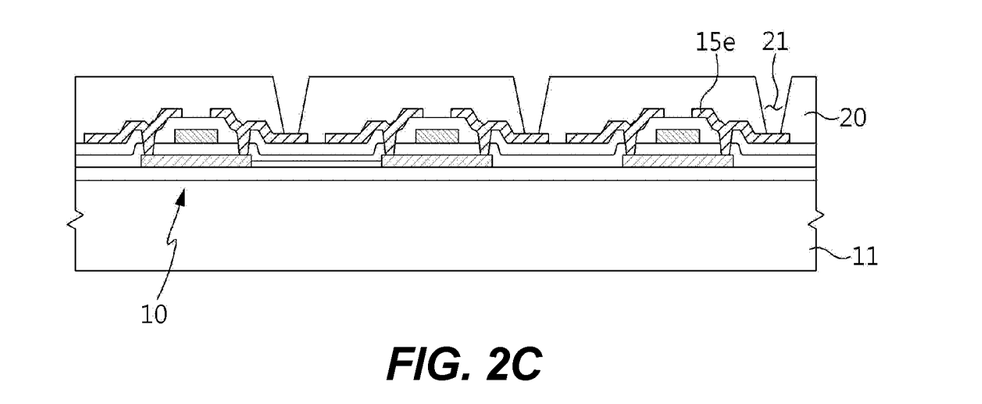

The organic insulating layer 20 may be formed over the entire upper surface of the array substrate 10 having the thin-film transistor 15 formed thereon.

For the organic insulating layer 20, an insulating material known in the art may be applied without limitation. Examples thereof may include an organic insulating material, such as acrylic resin, polyimide, BCB (Benzo Cyclo Butene) or PFCB, and, as necessary, an inorganic insulating material such as a silicon oxide film.

The contact holes 21 are formed in the organic insulating layer 20 so as to expose the drain electrode 15e of the thin-film transistor 15, and the drain electrode 15e of the thin-film transistor 15 may be electrically connected to an anode 40, which will be described later, via the contact holes 21.

As necessary, an overcoating layer (not shown) may be formed on the organic insulating layer 20 so that the array substrate 10 may become flat.

Figure 2D:
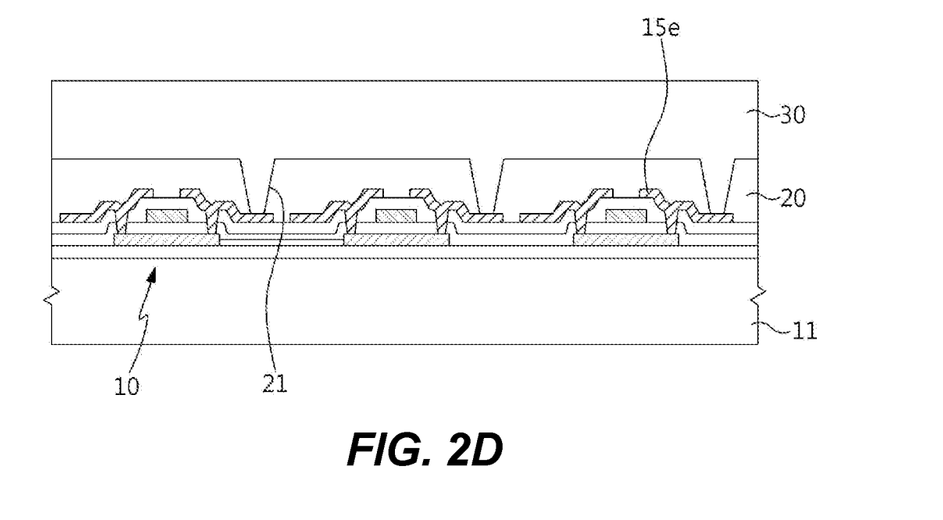
Figure 2E:
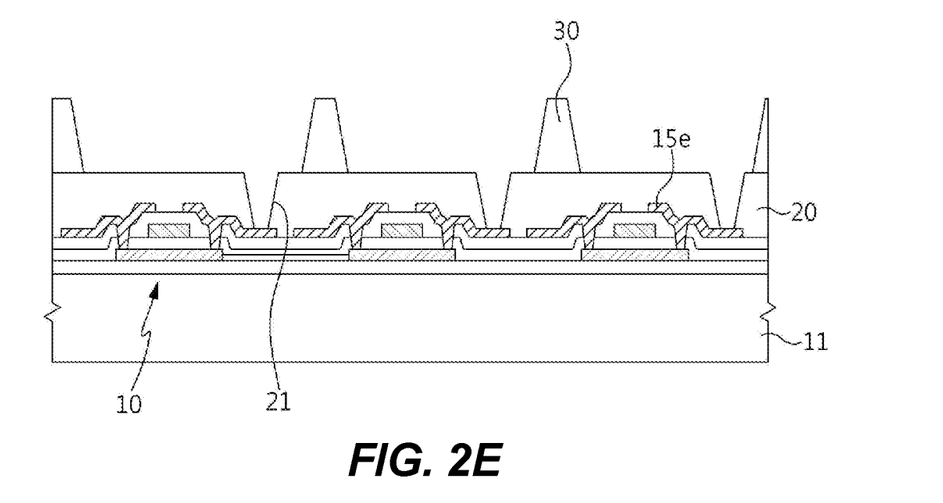
Figure 2F:
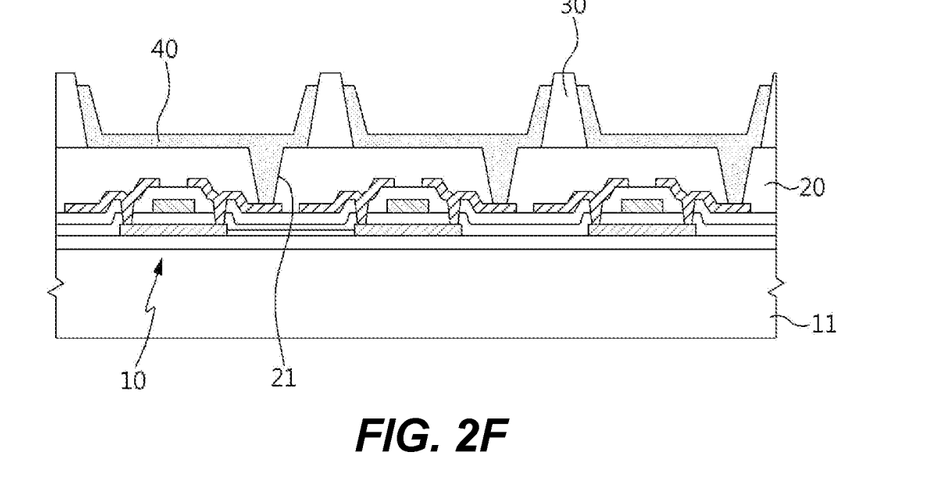

In the electroluminescent device 1 according to embodiments of the present disclosure, barriers 30 are disposed on the organic insulating layer 20 (see FIGS. 2D-2F).

Figure 2G:
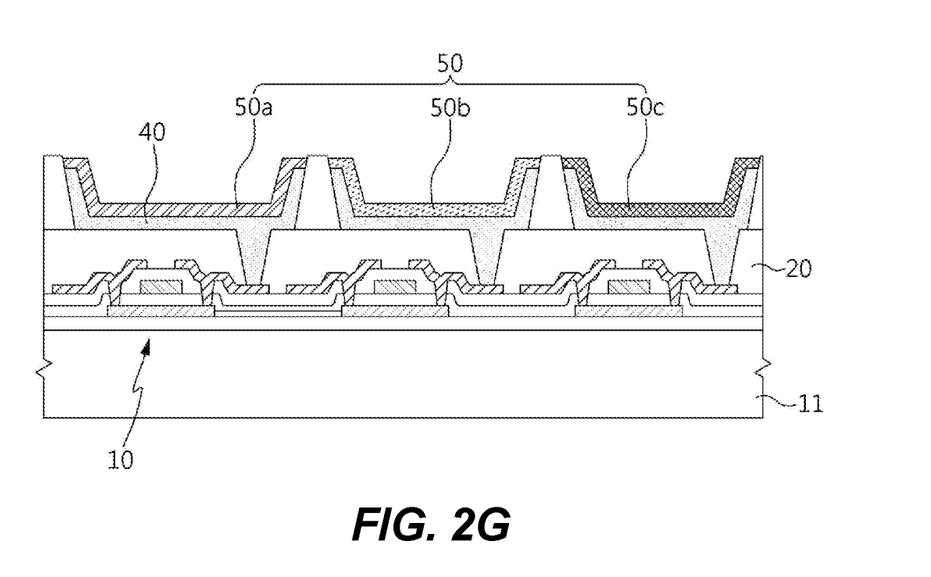
Figure 2H:
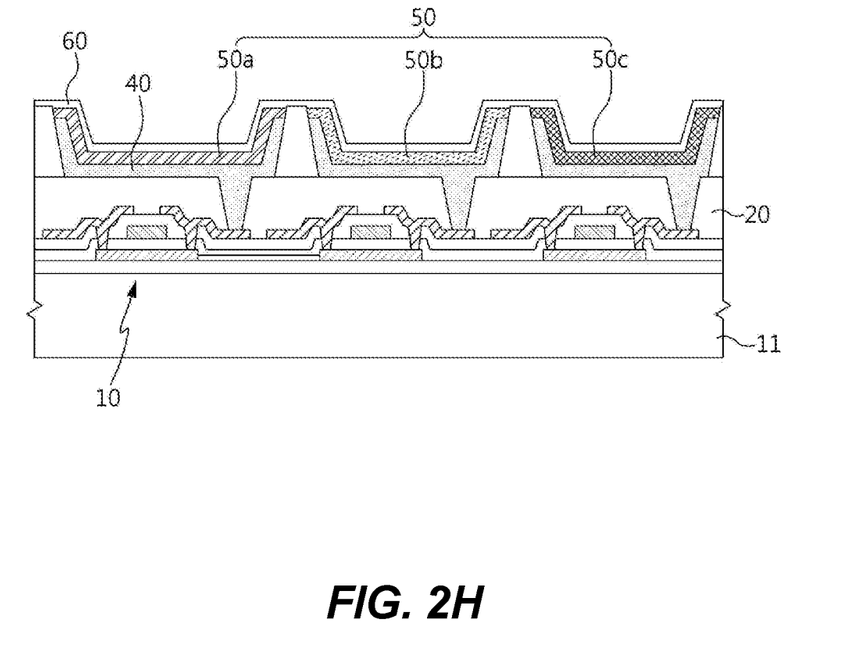

Referring to FIGS. 2G and 2H, barriers 30 function to separate a light-emitting layer 50 comprising a red-light-emitting layer 50a for emitting red light, a green-light-emitting layer 50b for emitting green light, and a blue-light-emitting layer 50c for emitting blue light, thus preventing the mixing of light output of specific colors from adjacent light-emitting layers. The barriers 30 are provided in the form of being inclined at a predetermined angle.

When a conventional electroluminescent device is of a top-emission type, in which light is directly emitted to the glass through the cathode upon light emission in proportion to the current flow from the anode to the cathode, the angle of the light that is outwardly emitted varies depending on the angle of the light that is incident on the cathode from the light-emitting layer and, thus, there may occur changes in the viewing angle of an image display device. Furthermore, when the light incident on the cathode from the light-emitting layer is at a predetermined angle or more, total reflection occurs and thus luminance of light that is outwardly emitted may be remarkably decreased.

As shown in FIG. 1, the electroluminescent device 1 according to this disclosure is configured such that the anode 40 is formed on the organic insulating layer 20 between the barriers 30 and on the opposite side slopes of the barriers 30, whereby the emission area is enlarged, thus significantly increasing the amount of light that is emitted. Moreover, the luminance of light that is outwardly emitted may be remarkably increased, and moreover, the viewing angle may be ensured, resulting in a high-quality image display device.

The anode 40 is electrically connected to the drain electrode 15e of the thin-film transistor 15 via the contact holes 21 formed in the organic insulating layer 20 so that holes are injected to the light-emitting layer 50, whereby the anode is paired with the cathode 60 to perform the function of applying electric energy to the light-emitting layer 50.

The material for the anode 40 is not particularly limited, so long as it has high electrical conductivity and high reflectivity and exhibits uniformity in a visible light range, and examples thereof may include silver (Ag), aluminum (Al), ITO, and IZO.

In order to increase emission efficiency and ensure a superior viewing angle, the anode 40 may be formed so as to completely cover the organic insulating layer 20 between the barriers and the opposite side slopes of the barriers 30. In this case, it is preferred that the anode 40 of this disclosure not be formed on the upper surface of the barriers so as to prevent shorting of the adjacent anodes with the barriers positioned therebetween.

The electroluminescent device 1 according to embodiments of the present disclosure includes the light-emitting layer 50 formed on the anode 40.

The light-emitting layer 50 of the disclosure may include an organic light-emitting compound or an inorganic light-emitting compound, and functions to generate light by combining holes and electrons injected through the anode 40, as described above, and the cathode 60, as will be described later.

The light-emitting layer 50 includes a red-light-emitting layer 50a for emitting red light, a green-light-emitting layer 50b for emitting green light, and a blue-light-emitting layer 50c for emitting blue light, with the barriers 30 positioned therebetween.

The light generated from the light-emitting layer 50 is emitted in the direction opposite the substrate. For example, when the light generated from the light-emitting layer 50 is emitted toward the anode 40, it is reflected from the anode 40, passes through the cathode, and is then outwardly emitted, and when the light is emitted toward the cathode 60, it is outwardly emitted through the cathode.

The light-emitting layer 50 is formed on the anode 40, whereby the emission area is enlarged, thus increasing the efficiency of emission of light from the organic light-emitting compound or the inorganic light-emitting compound contained in the light-emitting layer, and the brightness of the electroluminescent device may increase.

The organic light-emitting compound and the inorganic light-emitting compound are not particularly limited, and an organic light-emitting compound and an inorganic light-emitting compound known in the art may be used without limitation.

Figure 3:
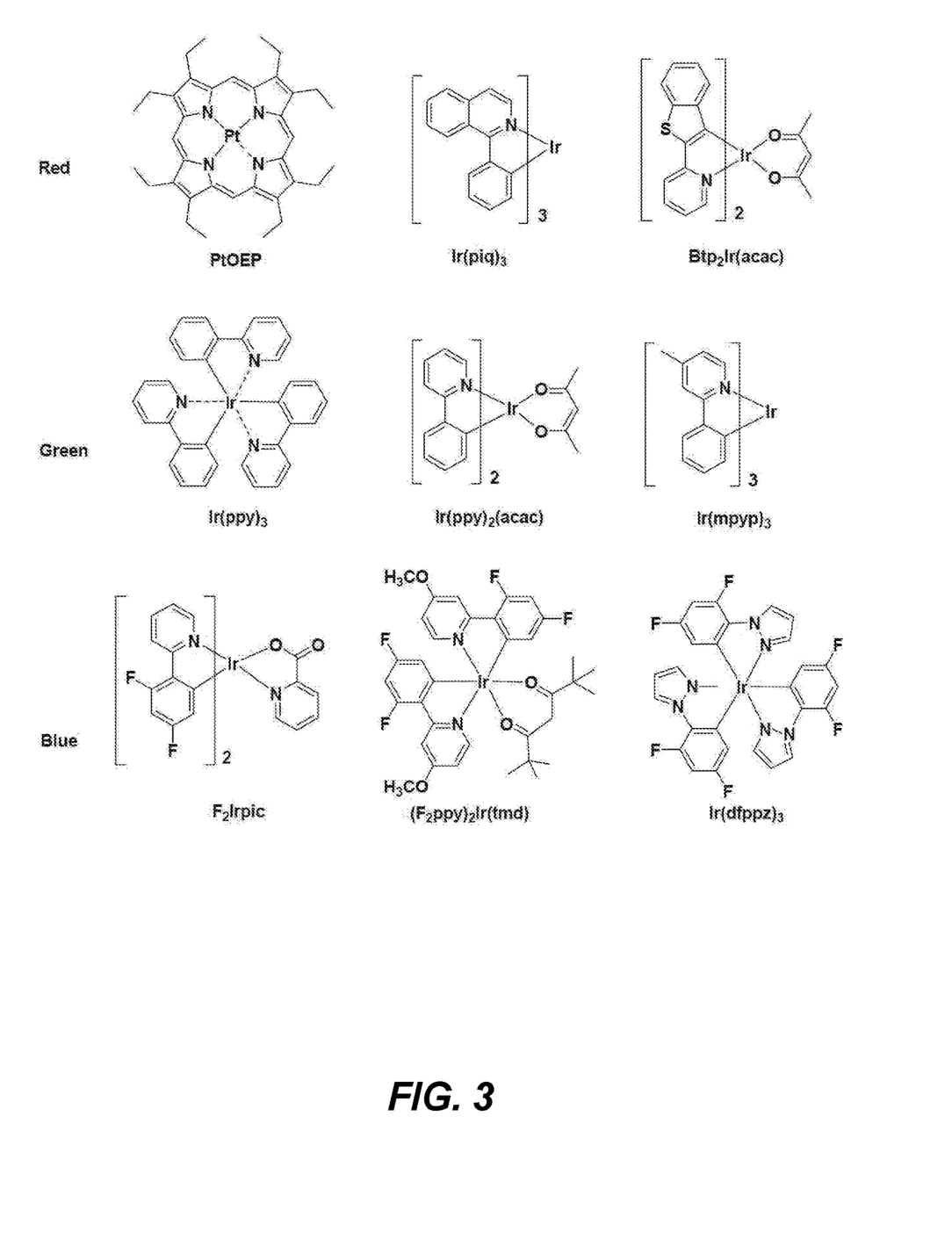
FIG. 3 shows examples of an organic light-emitting compound according to an embodiment of the disclosure.

For example, the organic light-emitting compound is well documented in the *Journal of Polymer Science and Technology*, Vol. 17, No. 1, pp. 43-50, and representative examples thereof are illustrated in FIG. 3.

In this disclosure, the light-emitting layer 50 may further include at least one layer of a hole injection layer, a hole transport layer, an electron transport layer, and an electron injection layer. When all of these layers are included, a hole injection layer, a hole transport layer, a light-emitting layer, an electron transport layer, and an electron injection layer may be sequentially stacked on the anode 40.

The electroluminescent device 1 according to this disclosure includes the cathode 60 formed on the light-emitting layer 50.

The cathode 60, which enables electrons to be injected to the light-emitting layer 50, is paired with the anode 40 to perform the function of applying electric energy to the light-emitting layer 50, as mentioned above.

The cathode 60 is formed of a transparent or translucent material, and allows light generated from the light-emitting layer to pass therethrough so as to outwardly emit the same.

As described hereinbefore in the disclosure, the anode 40 and the light-emitting layer 50 are formed even on the sides of the barriers, thus enlarging the emission area, thereby remarkably increasing emission efficiency and exhibiting a superior viewing angle.

Below, a method of manufacturing the electroluminescent device according to an embodiment of the disclosure is described in detail with reference to the accompanying drawings.

FIGS. 2A to 2H are cross-sectional views showing the process of manufacturing the electroluminescent device according to this disclosure.

The method of manufacturing the electroluminescent device according to the disclosure includes, as shown in FIG. 2A, preparing an array substrate 10 configured such that a blocking layer 12 for preventing damage to a semiconductor device due to impurities is formed on a substrate 11 made of glass, quartz or sapphire.

As shown in FIG. 2B, a thin-film transistor 15 is formed on the array substrate 10 including the substrate 11 and the blocking layer 12.

As described above, the thin-film transistor 15 may be configured to include an active layer comprising a source electrode region 15a, a channel pattern 15c and a drain electrode region 15d formed on the array substrate 10, a gate insulating film 13 formed on the entire surface of the array substrate including the active layer, a gate electrode 15b formed on the gate insulating film 13 on the channel pattern 15c, a source/drain insulating film 14 formed on the entire surface of the array substrate including the gate electrode 15b, and a source electrode 15f and a drain electrode 15e formed on the source/drain insulating film 14 so as to be electrically connected to the source electrode region 15a and the drain electrode region 15d via contact holes formed on the source electrode region 15a and the drain electrode region 15d, and the thin-film transistor 15 may be formed on the array substrate 10 using any typical process known in the art.

Next, as shown in FIG. 2C, an organic insulating layer 20 is formed flat at a predetermined thickness over the entire surface of the array substrate 10 having the thin-film transistor 15 formed thereon. Here, the organic insulating layer 20 is selectively etched through photolithographic etching so as to expose a portion of the drain electrode 15e of the thin-film transistor 15, thus forming contact holes 21, whereby the drain electrode 15e of the thin-film transistor 15 may be electrically connected to the anode 40 via the contact holes 21.

If necessary, in order to flatten the array substrate, an overcoating layer (not shown) may be further formed on the organic insulating layer 20.

In the method of manufacturing the electroluminescent device according to embodiments of the present disclosure, the anode 40 is formed, not only on the organic insulating layer 20, but also on the side slopes of the barriers 30, and thus the barriers 30 should be formed before formation of the anode 40.

As shown in FIG. 2D, in the method of manufacturing the electroluminescent device 1 according to the present disclosure, an insulating film for forming barriers 30 is formed on the array substrate 10 having the organic insulating layer 20 formed thereon.

Subsequently, the insulating film is patterned through photolithographic etching, and thus the barriers 30 inclined at a predetermined angle are formed, as shown in FIG. 2E.

Next, an anode 40 is formed on the upper surface of the array substrate 10 having the barriers 30 formed thereon.

As shown in FIG. 2F, the anode 40 is formed on the organic insulating layer 20 between the barriers 30 and on the side slopes of the barriers 30, so that the anode 40 is electrically connected to the thin-film transistor 15.

The process of forming the anode 40 is not particularly limited, and examples thereof may include thermal evaporation, e-beam deposition, sputtering, spin coating, chemical vapor deposition and laser deposition, whereby the anode 40 may be formed on the organic insulating layer 20 between the barriers 30 and on the side slopes of the barriers 30.

Forming the anode may be carried out so as to completely cover the organic insulating layer 20 between the barriers 30 and the opposite side slopes of the barriers 30 in order to increase emission efficiency and ensure a superior viewing angle. Here, it is preferred that the anode 40 of the disclosure not be formed on the upper surface of the barriers 30 so as to prevent shorting of the adjacent anodes with the barriers 30 positioned therebetween.

Next, as shown in FIG. 2G, a light-emitting layer 50 is formed on the anode 40 using an organic light-emitting compound or an inorganic light-emitting compound.

The light-emitting layer 50 includes a red-light-emitting layer 50a for emitting red light, a green-light-emitting layer 50b for emitting green light, and a blue-light-emitting layer 50c for emitting blue light, which are formed on the entire upper surface of the anode 40, with the barriers 30 positioned therebetween. Here, it is possible to further form a white-light-emitting layer for emitting white light, as necessary.

The process of forming the light-emitting layer 50 is not particularly limited, and examples thereof may include LITI (Laser-Induced Thermal Imaging), thermal evaporation, plasma sputtering, and printing, whereby the light-emitting layer may be formed on the anode 40.

As described above, when the light-emitting layer 50 is formed on the anode 40, the emission area may be enlarged, and thus the brightness of light emitted from the electroluminescent device by the organic light-emitting compound or the inorganic light-emitting compound contained in the light-emitting layer 50 may be increased.

In some embodiments, upon formation of the light-emitting layer 50, at least one layer of a hole injection layer, a hole transport layer, an electron transport layer, and an electron injection layer may be further formed. When all of these layers are formed, a hole injection layer, a hole transport layer, a light-emitting layer, an electron transport layer, and an electron injection layer may be sequentially stacked on the anode 40.

Next, as shown in FIG. 2H, a cathode 60 is formed on the light-emitting layer 50 using any typical process known in the art, thereby manufacturing an electroluminescent device 1.

The electroluminescent device 1 thus manufactured is enlarged in the emission area, thereby remarkably increasing emission efficiency and exhibiting a superior viewing angle.

Although the preferred embodiments of the disclosure have been disclosed for illustrative purposes, those skilled in the art will appreciate that various modifications, additions and substitutions are possible, without departing from the scope and spirit of the invention as disclosed in the accompanying claims.

What is claimed is:

1. An electroluminescent device having an emission area and wide viewing angle, the electroluminescent device comprising:
    an array substrate having a thin-film transistor formed thereon;
    an organic insulating layer formed on the array substrate having the thin-film transistor formed thereon;
    barriers disposed on the organic insulating layer, wherein the barriers have side slopes;
    an anode formed on the organic insulating layer between the barriers and on the side slopes of the barriers, wherein the anode completely covers the organic insulating layer between the side slopes of the barriers, which anode is electrically connected to the thin-film transistor;
    a light-emitting layer formed on the anode that completely covers the anode including the anode formed on the side slopes of the barriers, which light-emitting layer is contained by said barriers; and
    a cathode formed on the light-emitting layer,
    wherein the formation of the anode on the organic insulating layer and on the side slopes of the barriers increases the electroluminescent device's emission efficiency and viewing angle by enlarging the emission area.

2. The electroluminescent device of claim 1, wherein the light-emitting layer is formed of an organic light-emitting compound.

3. The electroluminescent device of claim 1, wherein the light-emitting layer is formed of an inorganic light-emitting compound.

4. The electroluminescent device of claim 1, wherein the barriers prevent mixing of light output from the light-emitting layer with adjacent light-emitting layers.

5. A method of making an electroluminescent device having an emission area and wide viewing angle, the method comprising:
    forming a thin-film transistor on an array substrate;
    forming an organic insulating layer on the array substrate having the thin-film transistor formed thereon;
    disposing barriers on the array substrate having the organic insulating layer formed thereon,. wherein the barriers have side slopes;
    forming an anode on the organic insulating layer between the barriers and on the side slopes of the barriers and electrically connected to the thin-film transistor, wherein the anode is formed so as to completely cover the organic insulating layer between the side slopes of the barriers; and
    forming a light-emitting layer on the anode so as to completely cover the anode and the side slopes of the barriers, which light-emitting layer is contained by the barriers,
    wherein the formation of the anode on the organic insulating layer and on the side slopes of the barriers increases the electroluminescent device's emission efficiency and viewing angle by enlarging the emission area.

* * * * *